US007558351B2

(12) United States Patent
Yang

(10) Patent No.: US 7,558,351 B2
(45) Date of Patent: Jul. 7, 2009

(54) SUPER HARMONIC FILTER AND METHOD OF FILTERING FREQUENCY COMPONENTS FROM A SIGNAL

(75) Inventor: Tony Yang, Irvine, CA (US)

(73) Assignee: Wionics Research, Irvine, CA (US)

( * ) Notice: Subject to any disclaimer, the term of this patent is extended or adjusted under 35 U.S.C. 154(b) by 585 days.

(21) Appl. No.: 10/904,469

(22) Filed: Nov. 11, 2004

(65) Prior Publication Data
US 2005/0175132 A1 Aug. 11, 2005

Related U.S. Application Data

(60) Provisional application No. 60/521,035, filed on Feb. 10, 2004.

(51) Int. Cl.
H04B 1/10 (2006.01)

(52) U.S. Cl. ........................ 375/350; 375/346; 375/229; 455/323; 455/326; 455/324

(58) Field of Classification Search ................. 375/350, 375/346, 229
See application file for complete search history.

(56) References Cited

U.S. PATENT DOCUMENTS

| 4,123,712 | A | | 10/1978 | Mikhael | |
| 4,325,076 | A | | 4/1982 | Harwood | |
| 4,326,109 | A | | 4/1982 | McGee et al. | |
| 4,618,831 | A | | 10/1986 | Egami et al. | |
| 4,962,510 | A | * | 10/1990 | McDavid et al. | ............. 375/308 |
| 5,226,057 | A | * | 7/1993 | Boren | ........................ 375/350 |
| 5,280,292 | A | | 1/1994 | Tondryk | |
| 5,715,529 | A | | 2/1998 | Kianush | |
| 6,236,847 | B1 | | 5/2001 | Stikvoort | |
| 6,388,543 | B1 | | 5/2002 | Molnar et al. | |
| 6,438,366 | B1 | * | 8/2002 | Lindfors et al. | ............. 455/334 |
| 6,441,682 | B1 | | 8/2002 | Vinn | |
| 6,552,630 | B2 | | 4/2003 | Chueh | |
| 6,687,494 | B1 | | 2/2004 | Mourant | |
| 6,778,594 | B1 | * | 8/2004 | Liu | ............................ 375/222 |
| 6,999,746 | B2 | | 2/2006 | Wang | |
| 7,043,220 | B1 | | 5/2006 | Ciubotaru | |
| 7,058,380 | B2 | * | 6/2006 | Sato | .......................... 455/260 |
| 7,375,582 | B2 | * | 5/2008 | Stikvoort | ..................... 327/552 |
| 2004/0116096 | A1 | * | 6/2004 | Shen | .......................... 455/323 |

FOREIGN PATENT DOCUMENTS

| TW | 41348 | 1/1982 |
| TW | 516276 | 1/2003 |
| TW | 527768 | 4/2003 |
| TW | 548906 | 8/2003 |

OTHER PUBLICATIONS

B. P. Lathi, Linear Systems and Signals, 1992 by Berkeley-Cambridge Press, ISBN 0-941413-34-9.*

* cited by examiner

Primary Examiner—Shuwang Liu
Assistant Examiner—Lihong Yu
(74) Attorney, Agent, or Firm—Winston Hsu

(57) ABSTRACT

A harmonic filter for filtering a plurality of frequency components from an input signal comprises a phase shifter for generating an in-phase signal and a quadrature-phase signal according to the input signal; and a plurality of polyphase filter networks coupled in series. The first polyphase filter network in the series is coupled to the phase shifter for receiving the in-phase and quadrature-phase signals. Each polyphase filter network is for filtering a corresponding one of the frequency components from the input signal.

8 Claims, 12 Drawing Sheets

SUPER HARMONIC FILTER AND METHOD OF FILTERING FREQUENCY COMPONENTS FROM A SIGNAL

CROSS REFERENCE TO RELATED APPLICATIONS

This application claims the benefit of the filing date of U.S. provisional patent application No. 60/521,035, filed Feb. 10, 2004 and entitled "Image Rejection Mixer", the contents of which are hereby incorporated by reference.

BACKGROUND OF INVENTION

1. Field of the Invention

The invention relates to electronic circuits, and more particularly, to filtering unwanted frequency components from a signal.

2. Description of the Prior Art

FIG. 1 shows a block diagram of a typical wireless transmitter 100. The transmitter 100 includes a quadrature modulator 102, an intermediate frequency (IF) local oscillator (LO) 104, a first filter 110, an up-converter 106, a radio frequency (RF) LO 108, and a second filter 112. The quadrature modulator 102 mixes the IF_LO signal (differentially represented as LO_I+ and LO_I−) with an incoming in-phase signal I and mixes a 90 degree phase delayed version of the IF_LO signal (differentially represented as LO_Q+ and LO_Q−) with an incoming quadrature-phase signal Q. The results of the two mixing operations are added and buffered to produce a differential IF signal (IF+, IF−). The IF signal (IF+, IF−) is filtered by the first filter 110 and is then input to the up-converter 106 where it is mixed with an RF_LO signal. The result is amplified and then filtered by the second filter 112 before being transmitted.

The reason the first and second filters 110, 112 are required is to filter out any unwanted spurious frequency components that would otherwise cause the wireless transmitter 100 to fail transmission mask requirements. These unwanted spurious frequency components are caused primarily from strong harmonics output by voltage controlled oscillators 114, 116 in the IF LO 104 and the RF LO 108, respectively. Because of an increasing demand by the general public for smaller and more ergonomic designs, telecommunication equipment (and particularly subscriber handset) manufacturers have sought higher levels of functional integration within their respective integrated circuit (IC) designs. However, as the implementations of the first and second filters 110, 112 require relatively large valued capacitors and inductors, it is difficult to move these filters into an IC, and as a result, off-chip filters, such as external ceramic filters, are usually utilized. As will be recognized by a person of ordinary skill in the art, a similar filtering problem is also present in the demodulation path of a wireless receiver.

FIG. 2 shows a frequency response 200 of a $3^{rd}$ order low pass filter, which could be implemented on-chip to allow the quadrature modulator 102, the up-converter 106, the first filter 110, and possibly the second filter 112 to be implemented as a single IC. As shown in FIG. 2, there are several disadvantages of using a $3^{rd}$ order low pass filter to allow the integration of the wireless transmitter 100 as a single IC. For example, a fundamental frequency f of the IF LO 104 or the RF LO 108 in FIG. 2 is the IF frequency (IF+, IF−) in the case of the first filter 110, or is the RF output signal RF_out in the case of the second filter 112, respectively. Because the fundamental frequency f is not located at dc (also known as baseband at substantially 0 Hz), the $3^{rd}$ order low pass filter actually attenuates the fundamental frequency f. This attenuation is shown in FIG. 2 as a dB value $A_{LOSS}$, which increases as f increases in frequency. Additionally, the $3^{rd}$ order filter provides insufficient attenuation on strong VCO odd harmonics such as the third harmonic $3f$, the fifth harmonic $5f$, and the seventh harmonic $7f$. Increasing the order of the filter will further attenuate these strong harmonics; however, the additional circuit complications, increased power consumption, and increased attenuation of the fundamental frequency prevent higher than $3^{rd}$ order filters from being practical solutions for integration into an IC.

SUMMARY OF INVENTION

One objective of the claimed invention is therefore to provide a super harmonic filter and associated method of filtering unwanted frequency components from a signal.

According to an embodiment of the present invention, a harmonic filter for filtering a plurality of frequency components from an input signal is disclosed. The harmonic filter comprises a phase shifter for generating an in-phase signal and a quadrature-phase signal according to the input signal; and a plurality of polyphase filter networks coupled in series, the first polyphase filter network in the series being coupled to the phase shifter for receiving the in-phase and quadrature-phase signals, each polyphase filter network being for filtering a corresponding one of the N frequency components from the input signal.

According to another embodiment of the present invention, a method of filtering a plurality of frequency components from an input signal is also disclosed. The method comprises phase shifting the input signal to form an in-phase signal and a quadrature-phase signal with a phase shifter; providing a plurality of polyphase filter networks being coupled in series; receiving the in-phase and quadrature-phase signals with a first one of the polyphase filter networks in the series; and filtering each of the plurality of frequency components from the input signal with a corresponding one of the plurality of polyphase filter networks.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
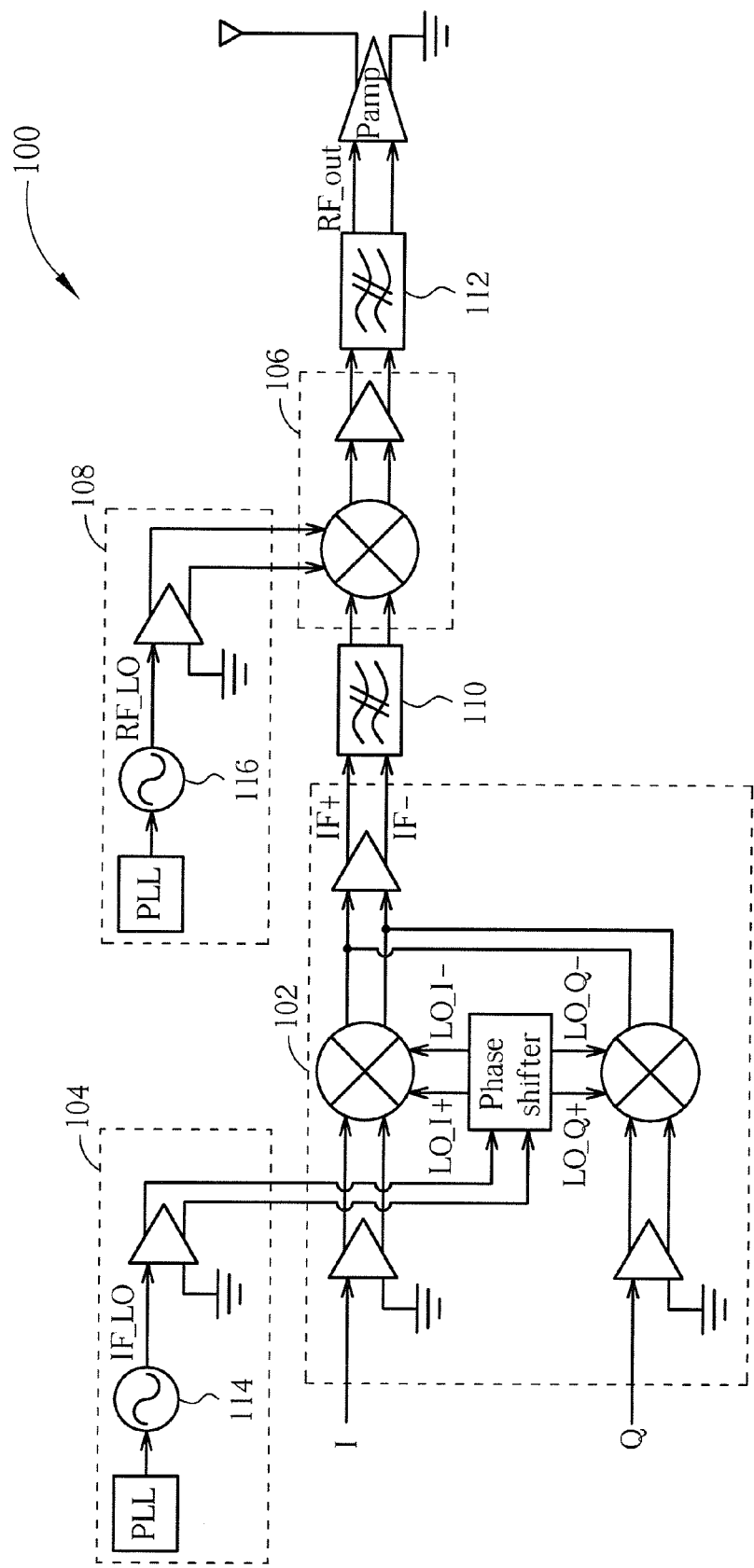
FIG. 1 is a block diagram of a typical wireless transmitter.
Figure 2:
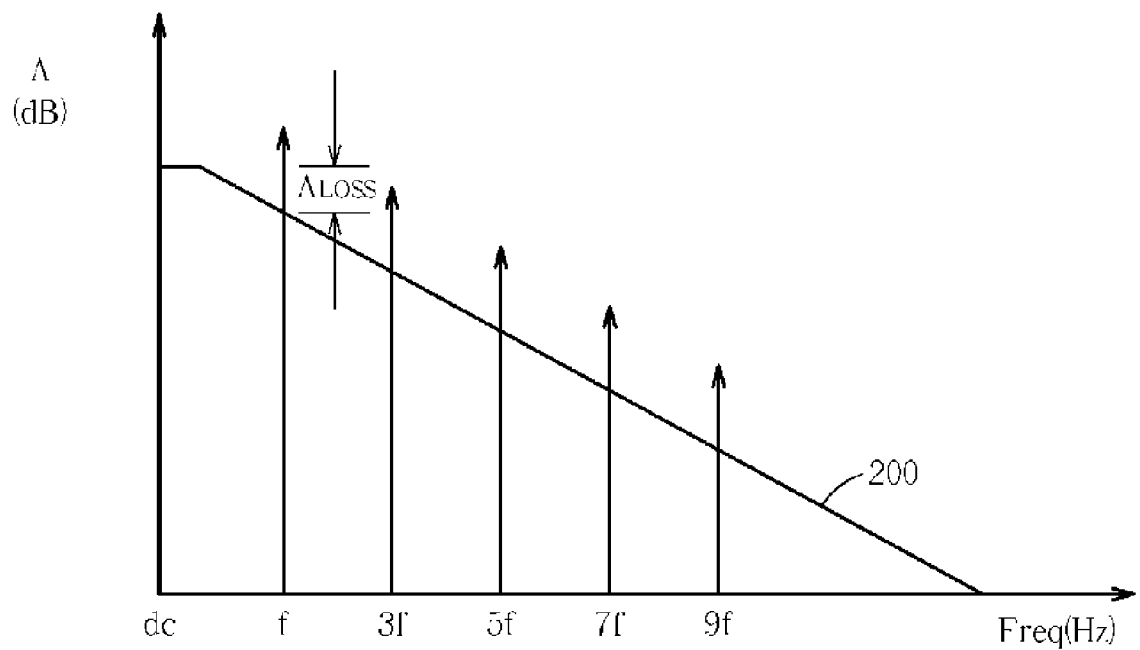
FIG. 2 is a frequency response of a $3^{rd}$ order low pass filter.
Figure 3:
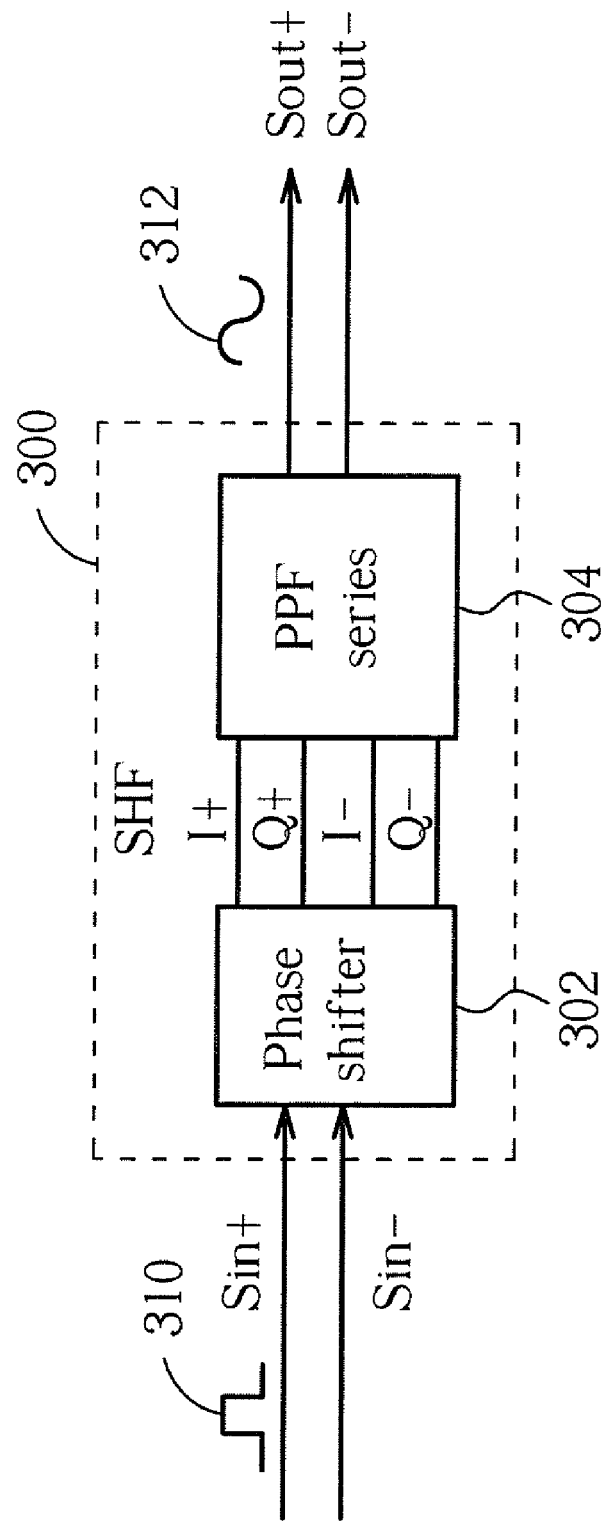
FIG. 3 is a block diagram illustrating a super harmonic filter according to an embodiment of the present invention.

FIG. 3 shows a block diagram illustrating a super harmonic filter 300 according to an embodiment of the present invention. The super harmonic filter 300 includes a phase shifter 302 and a series of polyphase filter networks (PPFs) 304. In FIG. 3 the super harmonic filter 300 receives a differential input signal (Sin+, Sin−) and generates a corresponding filtered output signal (Sout+, Sout−). As an example, FIG. 3 shows that the differential input signal (Sin+, Sin−) contains the fundamental frequency component at frequency f, as well as all the odd harmonics, as is represented by waveform 310 (a square wave). The super harmonic filter 300 filters a plurality of odd harmonic frequency components from the input signal (Sin+, Sin−). The output signal (Sout+, Sout−) has a plurality of odd harmonics removed, as shown by waveform 312 (nearly a sinusoidal waveform). It should also be noted that the fundamental frequency component is actually the $1^{st}$ harmonic and may also be filtered by the super harmonic filter 300 in another embodiment.

In order to further explain the operation of the super harmonic filter 300, knowledge pertaining to the operation of polyphase filter networks (PPFs) and pertaining to the concept of positive and negative frequencies, which are well known to those of ordinary skill in the art, are required. As such, U.S. Pat. No. 3,559,042, in which Gingell discloses the PPF and explains the concept of positive and negative frequencies, is incorporated herein by reference.

Figure 4:
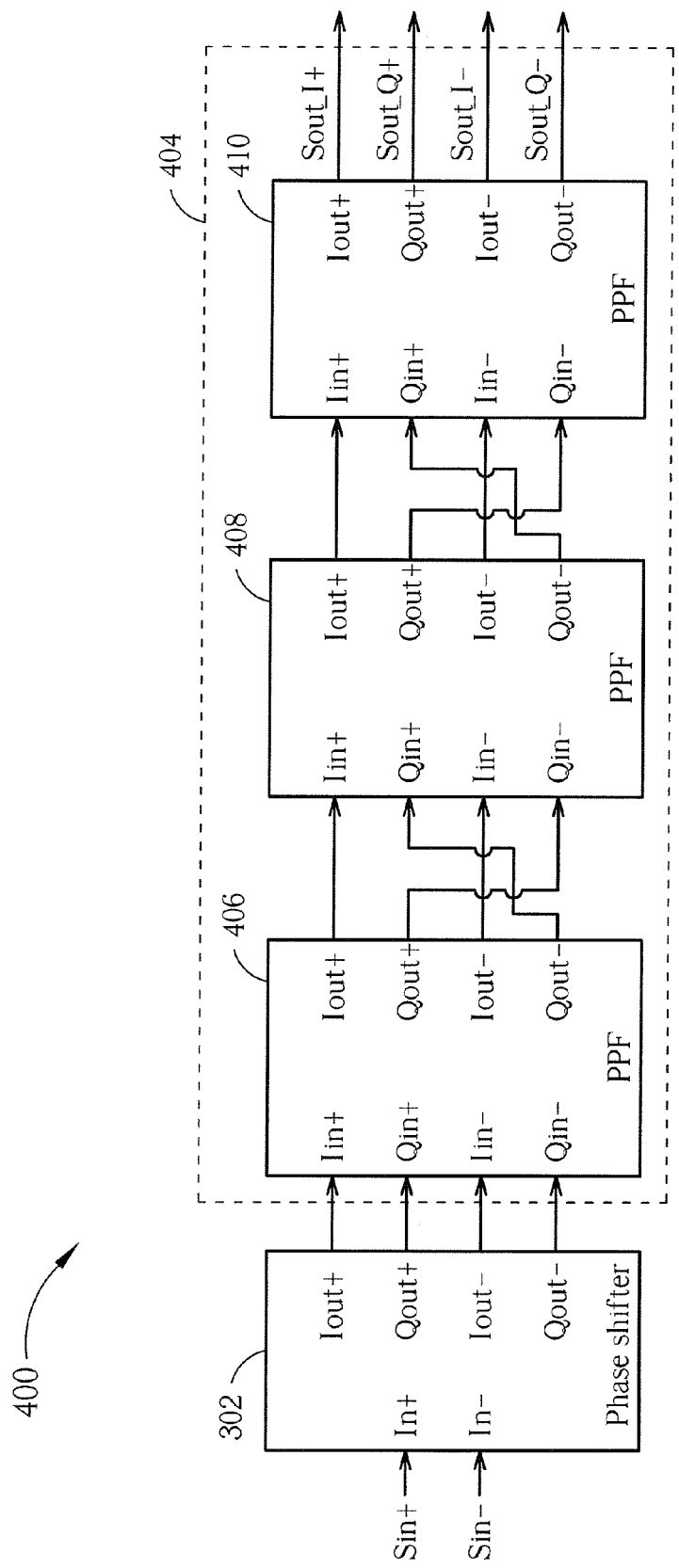
FIG. 4 is a detailed implementation of a first super harmonic filter according to a first embodiment of the present invention.

FIG. 4 shows a detailed implementation of a first super harmonic filter 400 according to a first embodiment of the present invention. In the first embodiment, the super harmonic filter 400 acts as a low pass filter and removes the $3^{rd}$, $5^{th}$, and $7^{th}$ harmonics of the input signal (Sin+, Sin−). The super harmonic filter 400 includes the phase shifter 302 and a plurality of PPFs 404 connected in series. The phase shifter 302 converts the input signal (Sin+, Sin−) to an in-phase signal ($Sin_{13}I+$, $Sin_{13}I-$) and a quadrature-phase signal ($Sin_{13}Q+$, $Sin_{13}Q-$). Wherein, the in-phase signal ($Sin_{13}I+$, $Sin_{13}I-$) is actually equal to the input signal (Sin+, Sin−), and the phase shifter 302 delays the phase of the input signal (Sin+, Sin−) by 90 degrees to form the quadrature-phase signal ($Sin_{13}Q+$, $Sin_{13}Q-$). Each PPF in the series of PPFs 404 is used to filter one of the unwanted odd harmonic frequency components. In this embodiment, a first PPF 406 is configured at the frequency of the $3^{rd}$ harmonic and removes the $3^{rd}$ harmonic from the input signal (Sin+, Sin−). Similarly, a second PPF 408 is configured at the frequency of the $5^{th}$ harmonic and removes the $5^{th}$ harmonic from the input signal (Sin+, Sin−), and a third PPF 410 is configured at the frequency of the $7^{th}$ harmonic and removes the $7^{th}$ harmonic from the input signal (Sin+, Sin−). It should be noted that the number of frequency components being filtered (i.e., the number of PPFs in the plurality of PPFs 404) and the position of frequency components being filtered (i.e., the order of harmonic being filtered) are design choices only and do not serve as limitations of the present invention.

Several preliminary definitions and observations are to be made in further exemplifying the embodiments of the present invention. Firstly, as is well known to a person of ordinary skill in the art, the odd harmonic frequency components of a signal alternate in polarity. In other words, the fundamental frequency (i.e. the $1^{st}$ harmonic) is initially designated positive, the $3^{rd}$ harmonic negative, the $5^{th}$ harmonic positive, the $7^{th}$ harmonic negative, and so on. Secondly, for negative frequency components, a PPF acts as a stop-band filter at the frequency for which it is configured. Thirdly, to convert a positive frequency to a negative frequency, or a negative to a positive, either reverse the positive and negative quadrature-phase signals or reverse the positive and negative in-phase signals. That is, in refrence to FIG. 4, either couple the positive and negative quadrature-phase inputs of a current PPF to the negative and positive quadrature-phase outputs of a previous PPF (or a previous phase shifter), respectively, as exemplified by the PPF 408 or 410, or couple the positive and negative in-phase inputs of a current PPF to the negative and positive in-phase outputs of a previous PPF (or a previous phase shifter), respectively.

Based on these definitions/observations, because the $3^{rd}$ harmonic is designated negative, the input connections to the first PPF 406 are coupled directly from the outputs of the phase shifter 302 and the first PPF 406 acts as a stop band at the $3^{rd}$ harmonic. Conversely, the $5^{th}$ harmonic is positive in frequency, and therefore, the positive and negative quadrature-phase inputs to the second PPF 408 are reversed. This reversal causes a sign reversal in the frequency and allows the second PPF 408 to act as a stop band at the $5^{th}$ harmonic. The $7^{th}$ harmonic would normally be negative, however, because of the reversal at the input to the second PPF 408, the $7^{th}$ harmonic has been converted to positive. Because of this, the positive and negative quadrature-phase inputs to the third PPF 410 are again reversed to return the $7^{th}$ harmonic to negative, which allows the third PPF 410 to act as a stop band at the $7^{th}$ harmonic. It should be noted that although reversing the positive and negative quadrature-phase inputs was used in FIG. 4 to toggle the frequency sign, in another embodiment, the positive and negative in-phase inputs may be instead reversed to toggle the frequency sign.

The following reversing decision table can be used to determine whether the positive and negative quadrature-phase signals (or the positive and negative in-phase signals) at the input of a PPF in the plurality of PPFs 404 need to be reversed to allow the PPF to act as a stop band at a particular frequency.

|  | Even number of preceding PPFs have inputs reversed | Odd number of preceding PPFs have inputs reversed |
| --- | --- | --- |
| Negative frequency sign (i.e., 1 + order of harmonic divisible by 4) | Do not reverse inputs | Reverse inputs |
| Positive frequency sign (i.e., 1 + order of harmonic not divisible by 4) | Reverse inputs | Do not reverse inputs |

If required, the differential in-phase output signal ($Sout_{13}I+$, $Sout_{13}I-$) and the differential quadrature-phase output signal ($Sout_{13}Q+$, $Sout_{13}Q-$) of the super harmonic filter can be added together to form a single differential output signal (Sout+, Sout−), such as is shown in FIG. 3. More specifically, to form a single differential output signal (Sout+, Sout−), couple the positive in-phase output signal ($Sout_{13}+$) with the positive quadrature-phase output signal ($Sout_{13}Q+$), and couple the negative in-phase output signal ($Sout_{13}I-$) with the negative quadrature-phase output signal ($Sout_{13}Q-$).

Figure 5:
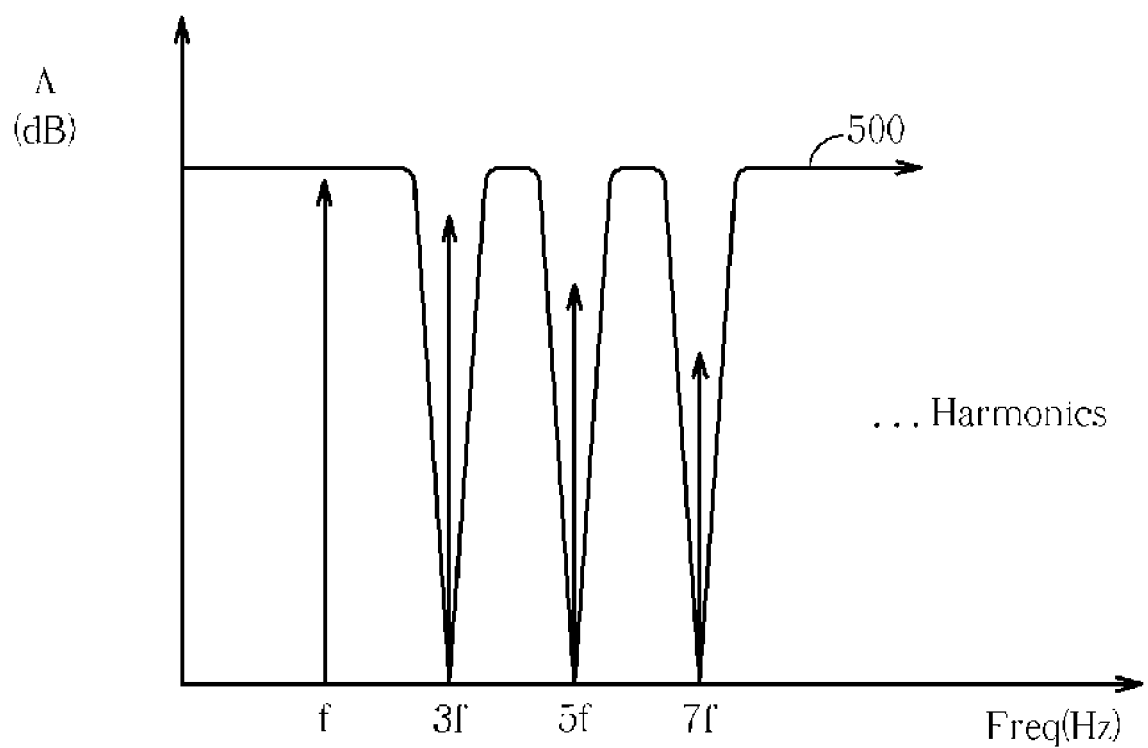
FIG. 5 is the resulting frequency response of the first super harmonic filter of FIG. 4.

FIG. 5 shows the resulting frequency response of the first super harmonic filter 400. The first PPF 406 acts as a band stop at the frequency (3*f*) of the $3^{rd}$ harmonic, the second PPF 408 acts as a band stop at the frequency (5*f*) of $5^{th}$ harmonic, and the third PPF 410 acts as a band stop at the frequency (7*f*) of the $7^{th}$ harmonic. It should be noted that the present invention is not limited by the order of the first, second, and third PPFs 406, 408, 410. In other embodiments of the present invention, different orders can be used while still adhering to the above table showing when to reverse the positive and negative signals on either the quadrature-phase or in-phase input signals to each PPF.

Figure 6:
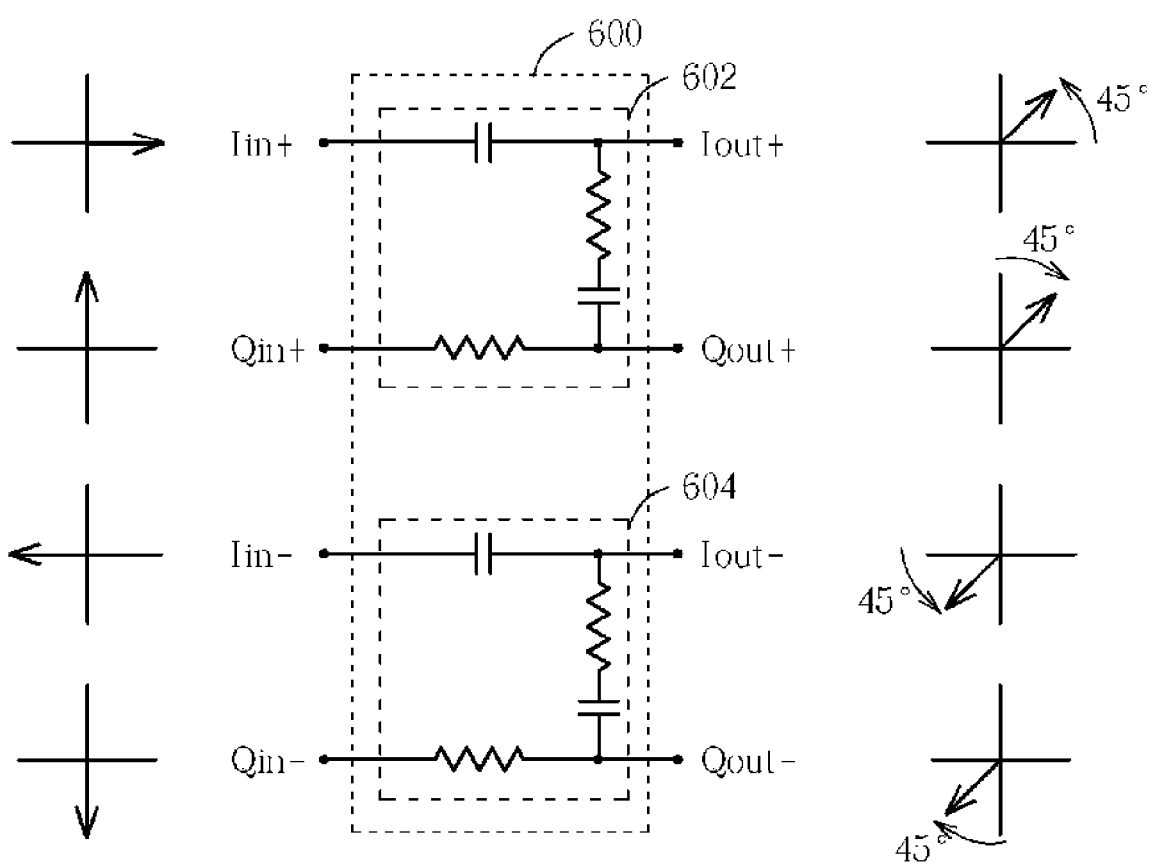
FIG. 6 is a circuit diagram of an equivalent PPF acting as a pass band for a positive frequency signal.

To further explain how each PPF in the plurality of PPFs 404 acts as a stop band at a particular frequency, FIG. 6 shows a circuit diagram of an equivalent PPF 600 acting as a pass band for a positive frequency signal. The equivalent PPF 600 is used to explain the operation of each PPF in the plurality of PPFs 404 and includes two RC-CR networks 602, 604, wherein the values of the resistors and capacitors in each RC_CR network 602, 604 are selected to tune the PPF 600 at the particular frequency. In this way, for positive frequency components, opposite 45-degree phase rotations are experienced at the outputs of the upper RC-CR network 602 and result in vectors having the same direction. Likewise, the opposite 45 degree phase rotations experienced at the outputs of the lower RC-CR network 604 result in vectors having the same direction. However, if the Qin+ and Qin− inputs are reversed or if the Iin+ and Iin− inputs are reversed (i.e., changing to a negative sign), the same 45-degree phase rotations will cause the vectors at the outputs the upper RC-CR network 602 to cancel and the vectors at the outputs the lower RC-CR network 604 to cancel. In this way, for negative frequency components, each PPF acts as a stop band and filters away the particular frequency component.

Figure 7:
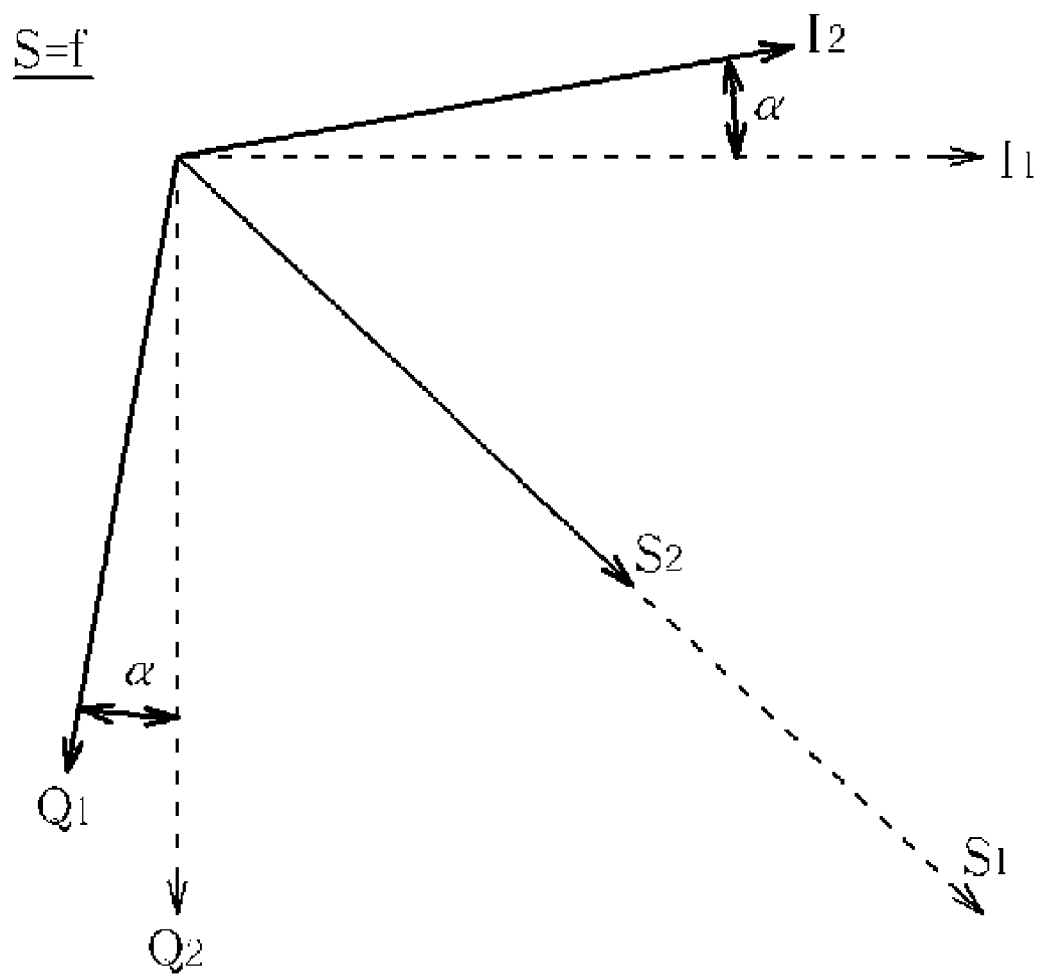
FIG. 7 is a diagram showing the phase vectors for a signal having a frequency different than the particular frequency for which the PPF of FIG. 6 is tuned.

While the particular negative frequency component, at which the PPF 600 is tuned, has been completely cancelled, FIG. 7 shows the phase vector for a frequency component positioned at a frequency other than such particular negative frequency component. An input vector, shown as dotted vector $S_1$, is formed by dotted vectors $I_1$ and $Q_1$. Away from the tuned frequency of the PPF 600, although both $I_1$ and $Q_1$ experience a phase shift of α, the value of α is not as significant as 45 degrees because the frequency of the input component is not situated at the particular frequency for which the PPF 600 is tuned. In this way, the resulting $I_2$ and $Q_2$ vectors do not cancel and instead add up to form an output vector $S_2$. As such, each PPF in the plurality of PPFs 404 only removes the particular frequency for which it is tuned.

Figure 8:
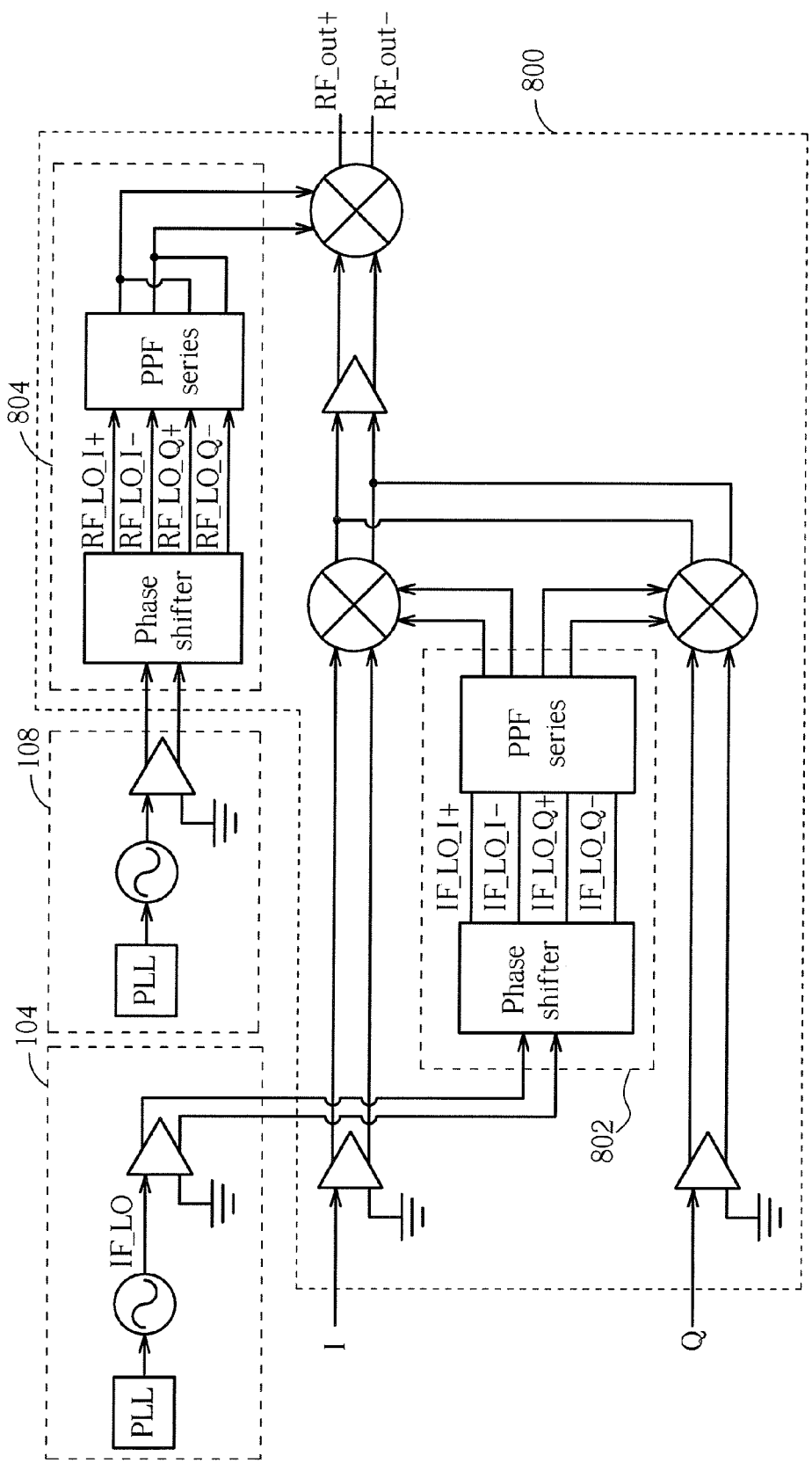
FIG. 8 is a diagram showing how a wireless transmitter can be implemented as a single IC using super harmonic filters according to an embodiment of the present invention.

FIG. 8 shows how a wireless transmitter can be implemented as a single IC 800 using super harmonic filters according to an embodiment of the present invention. The wireless transmitter IC 800 includes a first super harmonic filter 802, which filters a first plurality of unwanted harmonics from the IF LO 104 signal. A second super harmonic filter 804 is used to filter a second plurality of unwanted harmonics from the RF LO 108 signal. As shown in FIG. 8, the outputs of the first super harmonic filter 802 are left as separate in-phase and quadrature paths, which are input to the in-phase and quadrature-phase mixers, respectively.

Figure 9:
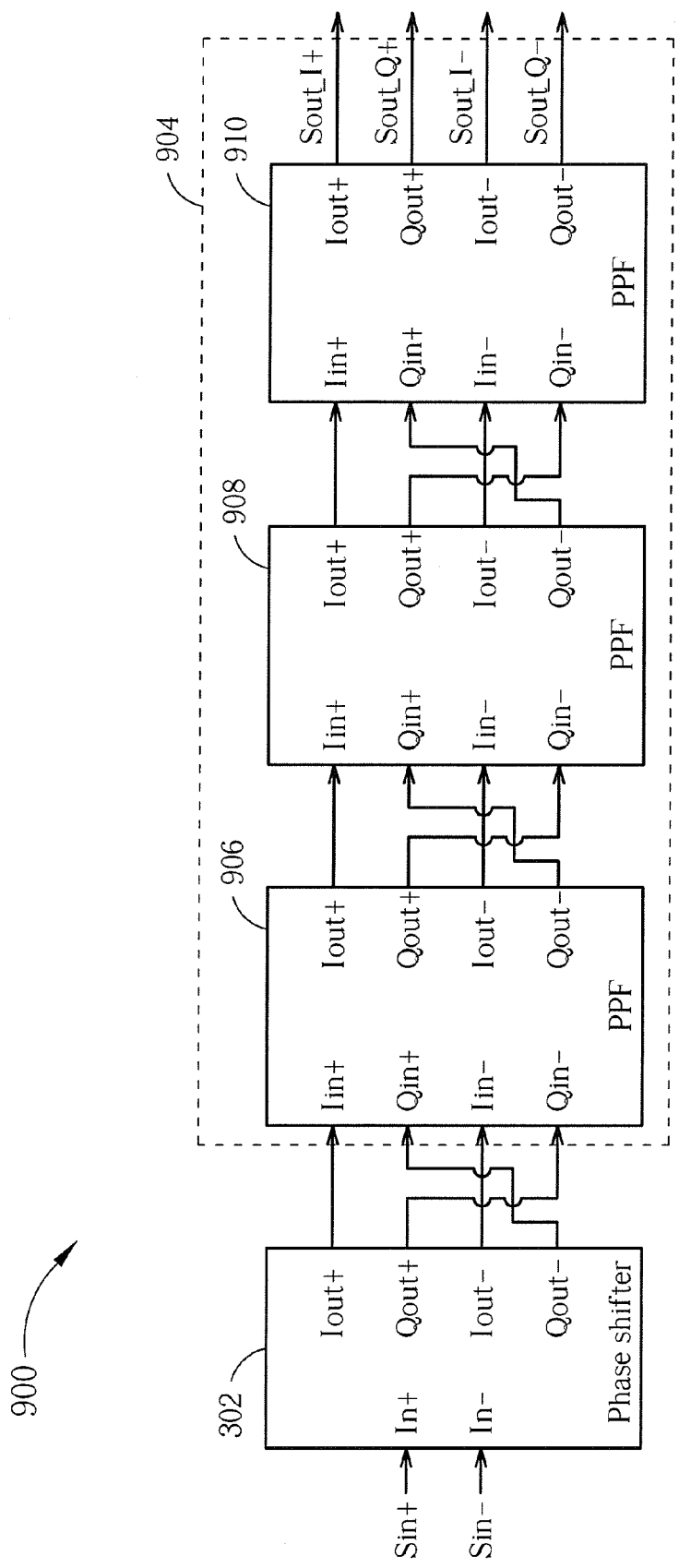
FIG. 9 is a detailed implementation of a second super harmonic filter according to a second embodiment of the present invention.
Figure 10:
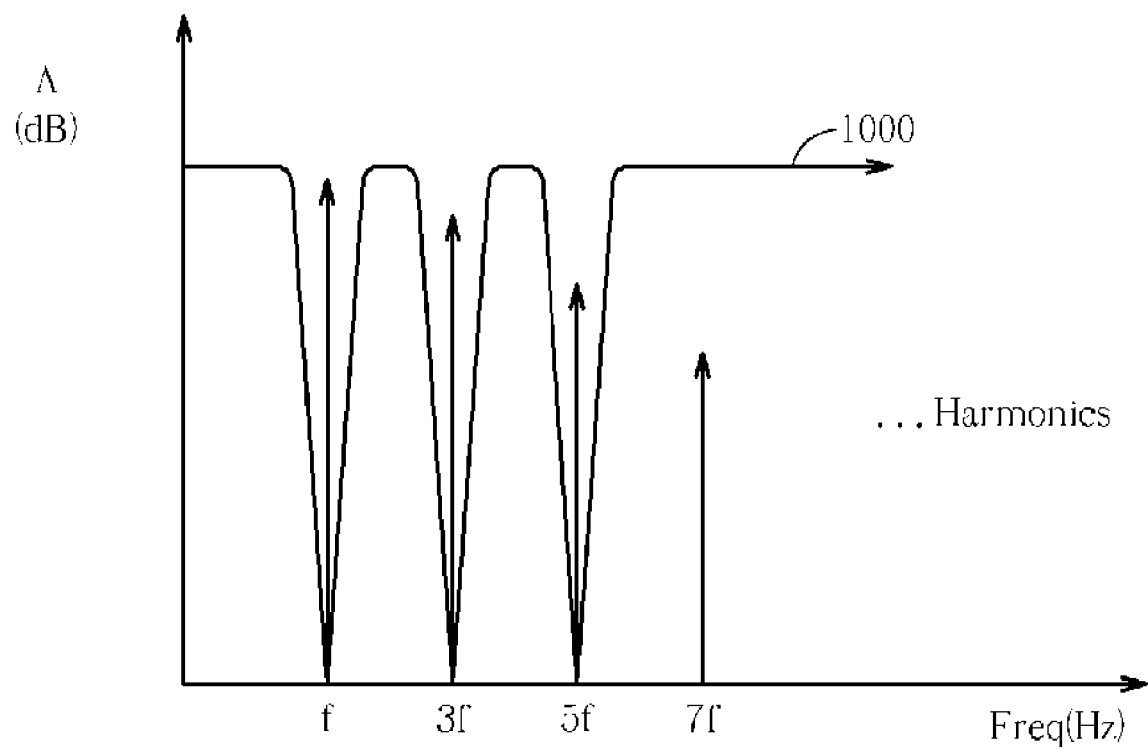
FIG. 10 is the resulting frequency response of the second super harmonic filter of FIG. 9.

Other embodiments of the present invention being used for different purposes are also possible. For example, FIG. 9 shows a detailed implementation of a second super harmonic filter 900 according to a second embodiment of the present invention. In the second embodiment, the super harmonic filter 900 acts as a high pass filter and removes the fundamental frequency f (i.e., the $1^{st}$ harmonic), the $3^{rd}$ harmonic, and the $5^{th}$ harmonic of the input signal (Sin+, Sin−). The super harmonic filter 900 includes the phase shifter 302 and a plurality of PFFs 904 connected in series. Using the above mentioned reversing decision table, because the fundamental frequency f is positive in frequency, the positive and negative quadrature-phase inputs to a first PPF 906 are reversed from the outputs of the phase shifter 302. Therefore, the first PPF 906 acts as a stop band at the fundamental frequency f. The positive and negative quadrature-phase inputs to a second PPF 908 are reversed, which causes a sign reversal in the frequency and allows the second PPF 908 to act as a stop band at the $3^{rd}$ harmonic. Again using the reversing decision table, the positive and negative quadrature-phase inputs to a third PPF 910 are again reversed to change the $5^{th}$ harmonic to negative frequency and allow the third PPF 910 to act as a stop band at the $5^{th}$ harmonic. FIG. 10 shows the resulting frequency response 1000 of the second super harmonic filter 900.

Figure 11:
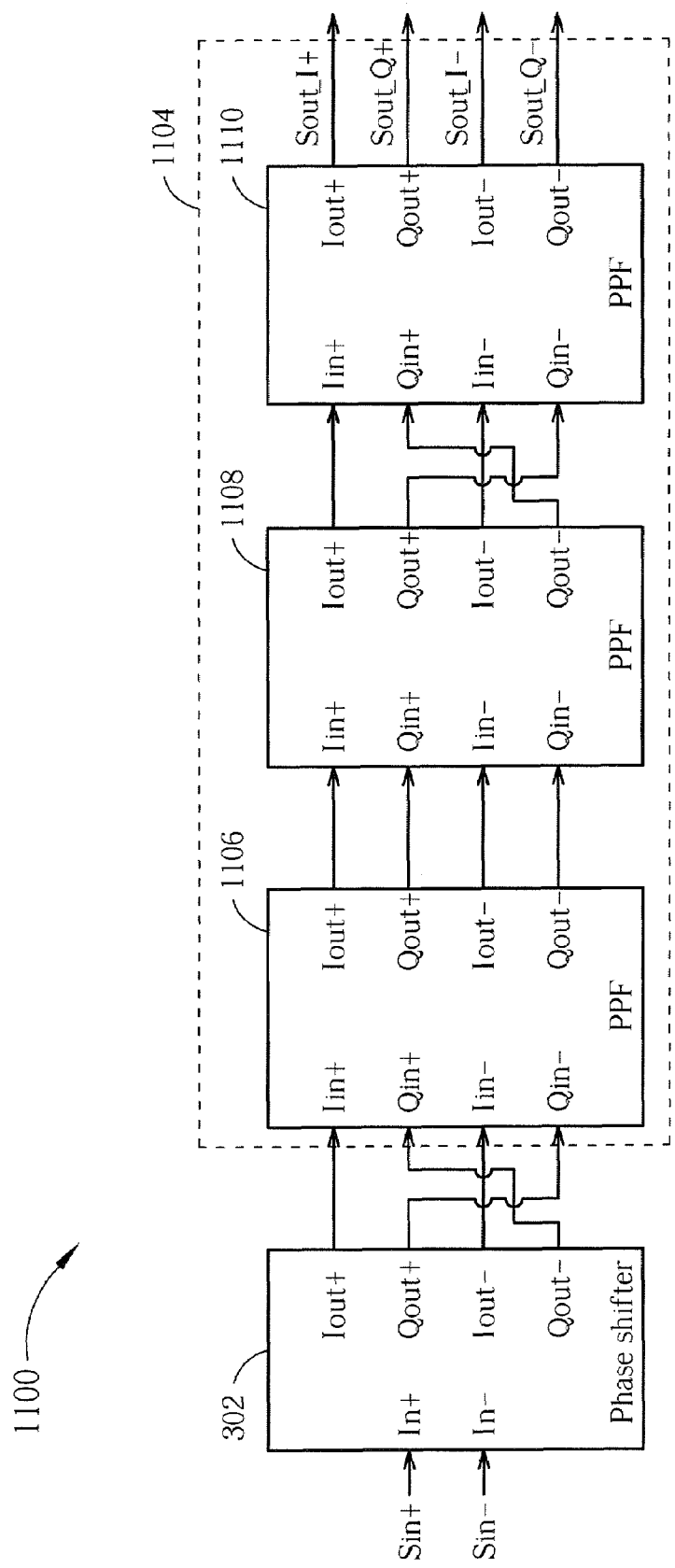
FIG. 11 is a detailed implementation of a third super harmonic filter according to a third embodiment of the present invention.
Figure 12:
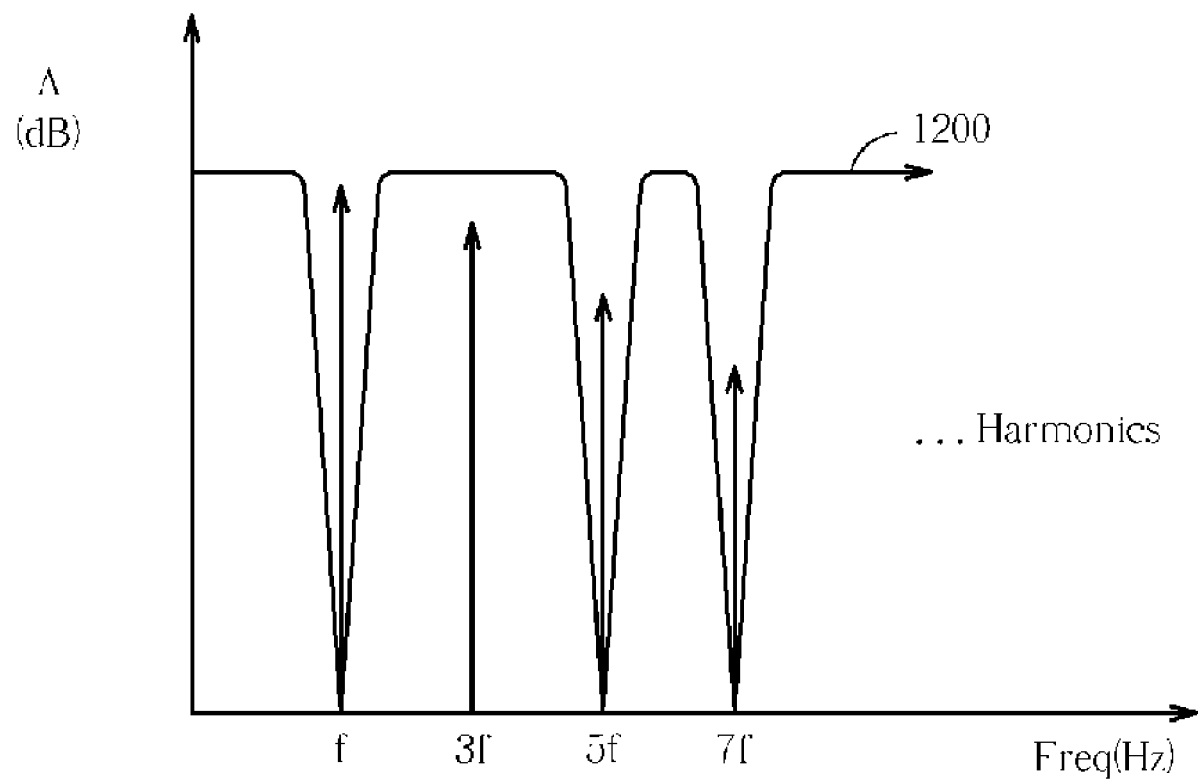
FIG. 12 is the resulting frequency response of the third super harmonic filter of FIG. 11.

FIG. 11 shows a detailed implementation of a third super harmonic filter 1100 according to a third embodiment of the present invention. In the third embodiment, the super harmonic filter 1100 acts as a band pass filter, which removes the fundamental frequency f (the $1^{st}$ harmonic), the $5^{th}$ harmonic, and the $7^{th}$ harmonic of the input signal (Sin+, Sin−), and passes the $3^{rd}$ harmonic. The super harmonic filter 1100 includes the phase shifter 302 and a plurality of PFFs 1104 connected in series. Using the reversing decision table, because the fundamental frequency f is positive in frequency, the positive and negative quadrature-phase inputs to a first PPF 1106 are reversed from the outputs of the phase shifter 302. Therefore, the first PPF 1106 acts as a stop band at the fundamental frequency f. The inputs to a second PPF 1108 are coupled directly from the outputs of the first PPF 1106 to allow the second PPF 1108 to act as a stop band at the $5^{th}$ harmonic. Again using the reversing decision table, the positive and negative quadrature-phase inputs to a third PPF 1110 are reversed to change the $7^{th}$ harmonic back to negative frequency and allow the third PPF 1110 to act as a stop band at the $7^{th}$ harmonic. FIG. 12 shows the resulting frequency response 1200 of the third super harmonic filter 1100.

It should also be noted that the present invention is not limited to PPFs being implemented in a known way, such as the equivalent PPF shown in FIG. 6. Other implementation such as symmetric PPFs as disclosed by Gingell can also be used. Additionally, a single-stage symmetrical PPF as disclosed by the same inventor in co-pending U.S. patent application Ser. No. 10/711,311 filed on Sep. 9, 2004, which is incorporated herein by reference, can also be used with the present invention and will reduce any mismatching between the in-phase and quadrature-phase paths. Finally, the actual number of PPFs connected in series of PPFs 304 and the order of these PPFs in the series are not limited to the examples shown.

Lastly, it should also be noted that the super harmonic filter detailed in the embodiments of the present invention can be utilized not only in a wireless transmitter, in a way as shown in FIG. 8, but also in any other circuitry in need of filtering functionality, in any possible fashion that may be contemplated by those of ordinary skill in the art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A harmonic filter for filtering a plurality of frequency components from an input signal, the harmonic filter comprising:

a phase shifter having a positive in-phase output, a negative in-phase output, a positive quadrature-phase output, and a negative quadrature-phase output, for generating an in-phase signal and a quadrature-phase signal according to the input signal; and a plurality of polyphase filter networks coupled in series, each having a positive in-phase input, a negative in-phase input, a positive quadrature-phase input, a negative quadrature-phase input, a positive in-phase output, a negative in-phase output, a positive quadrature-phase output, and a negative quadrature-phase output, the first polyphase filter network in the series being coupled to the phase shifter for receiving the in-phase and quadrature-phase signals, each polyphase filter network being for filtering a corresponding one of the frequency components from the input signal;

wherein either the positive quadrature-phase input and the negative quadrature-phase input of at least one of the polyphase filter networks are respectively coupled to the negative quadrature-phase output and the positive quadrature-phase output of a preceding polyphase filter network or of the phase shifter, or the positive in-phase input and the negative in-phase input of at least one of the polyphase filter networks are respectively coupled to the negative in-phase output and the positive in-phase output of a preceding polyphase filter network or of the phase shifter; and for each of the polyphase filter networks in the series, either the positive and negative quadrature-phase inputs or the positive and negative in-phase inputs are reversed if the frequency component being filtered by the polyphase filter network is positive and an even number of preceding polyphase filter networks have said reversed inputs.

2. The harmonic filter of claim 1, wherein for each of the polyphase filter networks in the series, either the positive and negative quadrature-phase inputs or the positive and negative in-phase inputs are reversed if the frequency being filtered by the polyphase filter network is negative and an odd number of preceding polyphase filter networks have said reversed inputs.

3. The harmonic filter of claim 1, wherein each polyphase filter network is a single-stage polyphase filter network.

4. A method of filtering a plurality of frequency components from an input signal, the method comprising:

phase shifting the input signal with a phase shifter to form an in-phase signal having a positive in-phase output and a negative in-phase output, and a quadrature-phase signal having a positive quadrature-phase output and a negative quadrature-phase output;

providing a plurality of polyphase filter networks being coupled in series, each having a positive in-phase input, a negative in-phase input, a positive quadrature-phase input, a negative quadrature-phase input, a positive in-phase output, a negative in-phase output, a positive quadrature-phase output, and a negative quadrature-phase output;

receiving the in-phase and quadrature-phase signals with a first one of the polyphase filter networks in the series; and filtering each of the plurality of frequency components from the input signal with a corresponding one of the plurality of polyphase filter networks;

wherein either the positive quadrature-phase input and the negative quadrature-phase input of at least one of the polyphase filter networks are respectively coupled to the negative quadrature-phase output and the positive quadrature-phase output of a preceding polyphase filter network or of the phase shifter, or the positive in-phase input and the negative in-phase input of at least one of the polyphase filter networks are respectively coupled to the negative in-phase output and the positive in-phase output of a preceding polyphase filter network or of the phase shifter; and for each of the polyphase filter networks in the series, either the positive and negative quadrature-phase inputs or the positive and negative in-phase inputs are reversed if the frequency component being filtered by the polyphase filter network is positive and an even number of preceding polyphase filter networks have said reversed inputs.

5. The method of claim 4, wherein for each of the polyphase filter networks in the series, either the positive and negative quadrature-phase inputs or the positive and negative in-phase inputs are reversed if the frequency being filtered by the polyphase filter network is negative and an odd number of preceding polyphase filter networks have said reversed inputs.

6. The method of claim 4, wherein each polyphase filter network is a single-stage polyphase filter network.

7. An apparatus for processing a received signal, the apparatus comprising:

a local oscillator (LO) signal generator for generating a LO signal;

a harmonic filter, coupled to the LO signal generator, for receiving the LO signal from the LO signal generator and for filtering a plurality of frequency components from the LO signal, the harmonic filter comprising:

a phase shifter for generating an in-phase LO signal and a quadrature-phase LO signal according to the LO signal; and a plurality of polyphase filter networks coupled in series, the first polyphase filter network in the series being coupled to the phase shifter for receiving the in-phase and quadrature-phase LO signals, each polyphase filter network being for filtering a corresponding one of the frequency components from the LO signal; and at least one mixing circuit, coupled to the harmonic filter, for receiving an output of the harmonic filter, for mixing the received signal with the output of the harmonic filter to produce a mixed signal at output of the at least one mixing circuit;

wherein the harmonic filter is coupled between the LO signal generator and the at least one mixing circuit, the phase shifter has a positive in-phase output, a negative in-phase output, a positive quadrature-phase output and a negative quadrature-phase output, each polyphase filter network has a positive in-phase input, a negative in-phase input, a positive quadrature-phase input, a negative quadrature-phase input, a positive in-phase output, a negative in-phase output, a positive quadrature-phase output and a negative quadrature-phase output, and for each of the polyphase filter networks in the series, either the positive and negative quadrature-phase inputs or the positive and negative in-phase inputs are reversed if the frequency component being filtered by the polyphase filter network is positive and an even number of preceding polyphase filter networks have said reversed inputs.

8. An apparatus for processing a received signal, the apparatus comprising:

a local oscillator (LO) signal generator for generating a LO signal;

a harmonic filter, coupled to the LO signal generator, for receiving the LO signal from the LO signal generator and for filtering a plurality of frequency components from the LO signal, the harmonic filter comprising:

a phase shifter for generating an in-phase LO signal and a quadrature-phase LO signal according to the LO signal; and a plurality of polyphase filter networks coupled in series, the first polyphase filter network in the series being coupled to the phase shifter for receiving the in-phase and quadrature-phase LO signals, each polyphase filter network being for filtering a corresponding one of the frequency components from the LO signal; and at least one mixing circuit, coupled to the harmonic filter, for receiving an output of the harmonic filter, for mixing the received signal with the output of the harmonic filter to produce a mixed signal at output of the at least one mixing circuit;

wherein the harmonic filter is coupled between the LO signal generator and the at least one mixing circuit, the phase shifter has a positive in-phase output, a negative in-phase output, a positive quadrature-phase output and a negative quadrature-phase output, each polyphase filter network has a positive in-phase input, a negative in-phase input, a positive quadrature-phase input, a negative quadrature-phase input, a positive in-phase output, a negative in-phase output, a positive quadrature-phase output and a negative quadrature-phase output, and for each of the polyphase filter networks in the series, either the positive and negative quadrature-phase inputs or the positive and negative in-phase inputs are reversed if the frequency being filtered by the polyphase filter network is negative and an odd number of preceding polyphase filter networks have said reversed inputs.

* * * * *